United States Patent [19]

Chin et al.

[11] Patent Number: 5,432,365

[45] Date of Patent: Jul. 11, 1995

[54] SEMICONDUCTOR MEMORY DEVICE

[75] Inventors: Dae-Je Chin; Chang-Hyun Kim, both of Seoul, Rep. of Korea

[73] Assignee: SamSung Electronics Co., Ltd., Suwon, Rep. of Korea

[21] Appl. No.: 38,842

[22] Filed: Mar. 9, 1993

Related U.S. Application Data

[63] Continuation of Ser. No. 292,103, Dec. 30, 1988, abandoned.

[30] Foreign Application Priority Data

Feb. 15, 1988 [KR] Rep. of Korea ................ 1556/1988

[51] Int. Cl.⁶ ..................... H01L 29/68; H01L 27/02
[52] U.S. Cl. ..................................... 257/301; 257/304
[58] Field of Search ............... 357/23.6; 257/301, 304

[56] References Cited

U.S. PATENT DOCUMENTS

| | | | |
|---|---|---|---|
| 4,792,834 | 12/1988 | Uchida | 357/23.6 |
| 4,918,502 | 4/1990 | Kaga et al. | 357/23.6 |
| 4,969,022 | 11/1990 | Nishimoto | 357/23.6 |
| 4,999,689 | 3/1991 | Iguchi et al. | 357/23.6 |
| 5,006,910 | 4/1991 | Taguchi | 357/23.6 |
| 5,170,234 | 12/1992 | Baglee et al. | 257/301 |

FOREIGN PATENT DOCUMENTS

| | | | |
|---|---|---|---|
| 60-128658 | 7/1985 | Japan . | |
| 60-152058 | 8/1985 | Japan . | |
| 61-090395 | 5/1986 | Japan | 357/23.6 |
| 62-208663 | 9/1987 | Japan . | |
| 62-213273 | 9/1987 | Japan . | |
| 62-249473 | 10/1987 | Japan . | |
| 2199695 | 7/1988 | United Kingdom | 357/23.6 |

Primary Examiner—Mark V. Prenty
Attorney, Agent, or Firm—Robert E. Bushnell

[57] ABSTRACT

There is disclosed a memory cell made with a semiconductor substrate for mounting integrated circuit elements, and having a trench for forming a capacitor region extending vertically to the surface of the substrate. In the substrate region around the trench is formed a cell plate region of second conductivity type for forming a charge storage region within the capacitor region. A high concentration semiconductor region of the same conductivity type as the substrate is formed in the substrate region outside the cell plate region to increase the charge stored in the capacitor region. A conducting material stores charge responding to the voltage given within the trench. A dielectric layer is formed between the conducting material and the cell plate.

36 Claims, 5 Drawing Sheets

SEMICONDUCTOR MEMORY DEVICE

This is a File-Wrapper-Continuation of application Ser. No. 07/292,103 filed on 30 Dec. 1988 and now abandoned.

BACKGROUND OF THE INVENTION

The present invention concerns a semiconductor memory device, and more particularly a dynamic random access memory (DRAM) having a large capacity.

In the technical field of semiconductor memory devices, there have been many attempts to increase the memory capacity by increasing the number of memory cells on a single chip. In order to achieve such an object, it is important to minimize the area of the memory cell array by forming a plurality of memory cells on a limited surface of the chip, and in view of the minimum area it has been well known that a memory cell consisting of one transistor and one capacitor is desirable. However, since the capacitor occupies most of the area of the memory cell formed by one transistor and one capacitor, it is important that though the area occupied by the capacitor is minimized, the capacitance thereof is increased so that the data reading operation is facilitated and the soft errors due to the alpha α particle are reduced.

In order to resolve the above problem, there have been proposed several methods for forming capacitors having trenches on the surface of a semiconductor substrate so that the area occupied by the capacitor is minimized and the capacitance of the capacitor is maximized. In fact, it is necessary to employ the trench type construction in a DRAM having storage capacity more than four mega-bits.

An example of the memory cell employing a conventional trench construction is disclosed in pages 272–273 of ISSCC Digest of Technical Papers issued February, 1986.

Because the above memory cell has a cell plate of polysilicon formed on the upper surface of the substrate, the plate connection is difficult in a memory cell with a large integration of more than 16 kilo-bits, and the cell plate of polysilicon may easily produce the step coverage which causes a stringer to be produced. Furthermore, as the above memory cell stores the charge outside the trench, soft errors may easily occur.

On the other hand, in the stacked memory cell with cell plates formed on the word lines, the problem inherent in the above memory cell due to the plate may be resolved. However, if the trenches are formed in large integration, the two adjacent trenches are separated from each other by a thick field oxide layer, so that the lower part of the field oxide layer can not be effectively employed. Therefore, the degree of integration can not be increased.

An U.S. patent application Ser. No. 000743 filed on Oct. 16, 1987 and now abandoned, discloses a memory cell to solve the problems inherent in the above two types of memory cells. In the memory cell of the U.S. patent application No. 000743, since the cell plate formed in the substrate has the same potential as the substrate, to the cell plates cannot be independently applied a voltage different from that of the substrate.

SUMMARY OF THE INVENTION

It is an object of the present invention to overcome the above drawbacks of prior art and integrate a plurality of elements with high density, on a semiconductor substrate.

It is another object of the present invention to provide a memory cell having one transistor and one capacitor which, being fabricated with an allowable processing efficiency, has the cell plate submerged in the substrate, and enables a voltage different from that of the substrate to be applied to the cell plate.

It is a further object of the present invention to provide a memory cell which is highly immune to the noises and has the submerged cell plate.

It is also a further object of the present invention to provide a memory cell having such a form and structure that facilitates an increase in the fabrication efficiency.

According to the present invention, a memory cell includes a semiconductor substrate for mounting integrated circuit elements, a trench for forming a capacitor region extending vertically to the surface of the substrate, the trench being formed in the substrate, a cell plate region of second conductivity type for forming a charge storage region within the capacitor region, said cell plate region being formed in the substrate region around the trench, a high-concentration semiconductor region of the same conductivity type as that of the substrate for increasing the electric charge stored in the capacitor region, the high-concentration semiconductor region being formed in the substrate region outside the cell plate region, a conducting material for storing the electric charge responding to the voltage given within the trench, and a dielectric layer formed between the conducting material and the cell plate.

In the inventive structure, the submerged storage capacitor cooperates with the transfer transistor comprising one transistor in the DRAM memory cell. This submerged storage capacitor includes a substrate, a trench for forming a capacitor region extending appoximately vertically to the surface of the substrate, the trench being formed in said substrate, a region doped with the ions of the opposite conductivity against the substrate for forming the cell plate in the substrate region outside the trench, another region doped with the ions of the same conductivity type as the substrate, said the latter region being formed in the substrate region outside cell plate, a conductive polysilicon core filled in the trench to store the charge responding to the received voltage as well as to form one electrode of the capacitor, a dielectric material for serving as the capacitor insulator disposed between the conducting polysilicon core and cell plate, and a conductive connector of a doped polysilicon, by connecting the source region of the transfer transistor with the conducting core, so as to form the passage enabling the charge to flow into or out of the storage capacitor.

The doped regions formed in the substrate region outside the trench are disposed in a successive stages. At first shallow trench is formed, and on the side walls of the trench are formed oxide layers. In the bottom of the shallow trench is formed a second deep trench, which has no oxide layer. Hence, the dopant introduced into the trench penetrates the substrate through the walls of the deep trench, while the side walls of the shallow trench are not doped because of the oxide layers formed thereon.

DETAILED DESCRIPTION OF THE PREFERRED EMBODIMENT

The present invention will now be described more specifically with reference to the drawings attached only by way of example.

Figure 1:
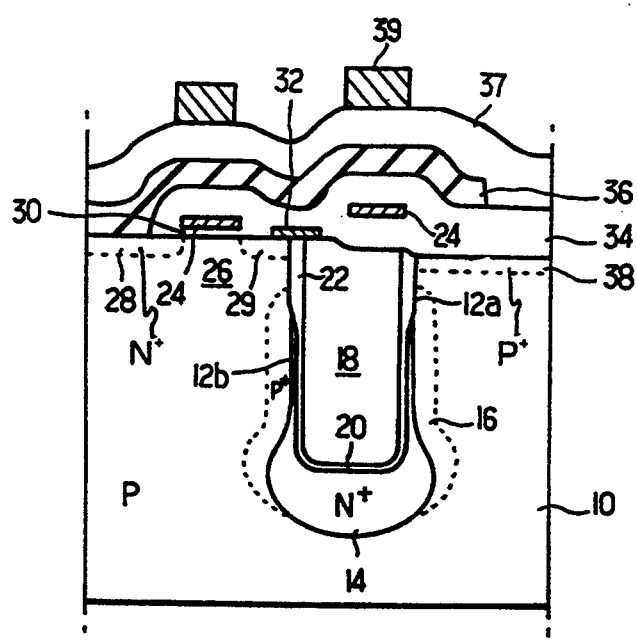
FIG. 1 is a cross section view of an one transistor memory cell with the submerged storage capacitor according to a preferred embodiment of the present invention.

FIG. 1 is a cross section for illustrating the submerged storage capacitor in a one transistor memory cell according to the present invention. The reference numeral 10 indicates a P-type or N-type semiconductor substrate. Hereinafter, the description will be made for convenience with reference to the P-type substrate, but the inventive concept is also applied to the N-type substrate. A capacitor is formed in a trench having generally a conical shape, the inside of which trench is vertical to the surface of the semiconductor substrate. The trench includes the shallow and wide portion 12a, and the deep and narrow portion 12b. In the peripheral area are formed the N+ cell plate 14 highly doped with arsenic, phosphorous, etc. of the opposite conductivity type to the substrate, and the P+ region 16 highly doped with boron, etc. of the same conductivity type as the substrate. The N+ cell plate region 14 forms one electrode of the capacitor.

The hard polysilicon core 18 formed in the trenches 12a and 12b forms the other conducting electrode of the capacitor. This core 18 is isolated from the highly doped N+ cell plate region 14 by the dielectric layer 20 composed of an oxide layer or a composition of the oxide and nitride. The thickness of the dielectric layer is approximately 100–200 Å.

The trenches are continuously formed by the process described below. During the first step of the process shallow trench is formed 12a in the substrate by reactive ion etching. This shallow trench 12a extends approximately 1.5 μm into the substrate. When this shallow trench is formed, oxide layers are deposited on the inside and bottom thereof. Thereafter, once the bottom of the shallow trench is etched by anisotropic etching, the whole oxide layer 22 remains on the inside wall of the trench so as to block the diffusion of impurities in a subsequent impurity diffusion process. In a second step of the process, the deep trench 12b having the thickness of about 3–3.5 μm is formed in the bottom of the shallow trench by etching. Impurities are introduced into the side walls of the deep trench in order to form the highly doped N+ region and P+ region. At this time, the oxide layer 22 deposited on the inside walls of the shallow trench 12a serves as a barrier during the inpurity diffusion process.

The transfer transistor includes the gate 24, and the drain and source regions 28 and 29 separated by the channel region 26 below the gate 24. The gate 24 and the channel region 26 of the transistor are isolated from each other by the gate insulating layer 30 so as to limit the current flows between the drain and source regions 28 and 29 responding to the control signal applied to the gate 24. The source region of the transistor and the polysilicon core 18 are connected with each other via a conducting polysilicon 32 so as to transfer charges between the storage capacitor and the circuit for employing the charges. Insulating layers 34 and 37 cover various other layers on the semiconductor substrate, thereby protecting them. Conductors such as the conductor 36 formed so as to be connected with the drain region 28 of the transfer transistor, serve to transfer the signals of the various elements. The conductor 39 is made of metal.

FIG. 1 illustrates a cross section of the submerged storage capacitor. The P+ doping layer 38 below the insulating layer 34 is formed to reduce the leakage currents between the adjacent trenches. Furthermore, it is well known to those skilled in the art that the P+ region 16 outside the N+ cell plate region 14 isolates the N+ cell plate region 14 from the source region 29 of the transfer transistor to block the leakage current, thereby serving to increase the capacitance of the storage capacitor.

Figure 2:
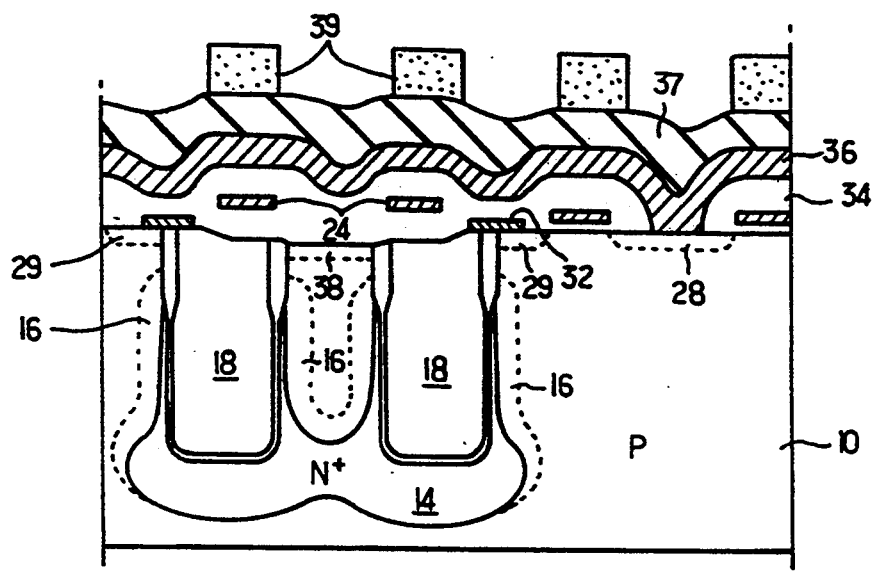
FIG. 2 is a cross section view for illustrating the connection between the memory cell according to a preferred embodiment of the present invention and its adjacent cell.

FIG. 2 is a cross-section view for illustrating the connections between the adjacent cells, where the same reference numerals are used for the parts identical to those of FIG. 1. As shown in the drawing, the adjacent cells are connected with each other via the N+ cell plate 14.

Figure 3:
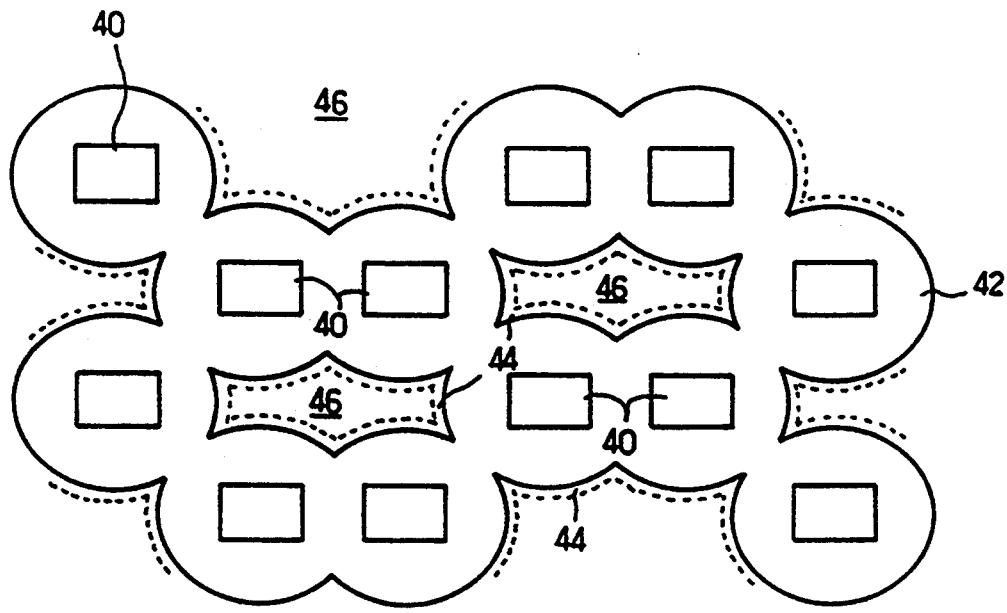
FIG. 3 is a plan view of a part of a memory cell according to the present invention.
Figure 4:
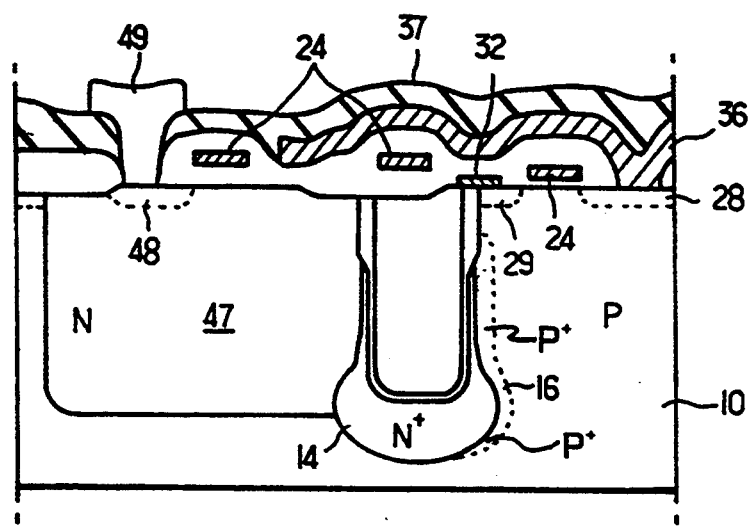
FIG. 4 is a cross section view for illustrating a memory cell of the the present invention to apply a voltage to the cell plate.

FIG. 3 is the top view for illustrating a part of the memory cell array having the above structure. Numeral 40 indicates the trench region forming the capacitor, numeral 42 the N+ doped cell plate region, 44 the P+ doped region, and 46 the P-type substrate region. As shown in the drawing, the N+ cell plate regions (the region 14 in FIG. 2) formed around the trench are connected to each other. At a specified terminal of the memory cell array is provided a fixed voltage to the N+ cell plate region 42, which is illustrated in FIG. 4. The same reference numerals are used to indicate the parts of FIG. 4 identical to those of FIGS. 1 and 2.

In an ending portion of the memory cell array as shown in FIG. 3 is formed the N-well 47 as shown in FIG. 4, to connect with the N+ cell plate region 14. On the upper part of the N-well 47 is formed the N+ doping layer 48 which is connected with the conductor 49. When a fixed voltage is applied to the conductor 49, voltage is supplied through the N-well 47 to the N+ cell plate 14. Hence, if the voltage is supplied to the N+ cell plate 14 connected with the N-well 47 due to the voltage applied to the N-well 47, all the N+ cell plates 14 also receive the voltage because of their interconnections. It is preferable to apply the voltage of $V_{CC}/2$ (a half of the source supply voltage: $V_{CC}$) to the N-well. If the cell plate 14 receives the voltage of $V_{CC}/2$, the thickness of the insulating layer of the capacitor is reduced, thereby increasing the capacitance.

Hereinafter, with reference to FIGS. 5(A)–5(I) will be explained the steps of forming the DRAM cells on the silicon semiconductor substrate according to the present invention.

The starting material of silicon semiconductor wafer 50 is the N-type or P-type substrate, in which the N-well or P-well is formed by the conventional process of diffusion or ion implantation. The impurity concentration in the substrate of the well 52 formed at this time is about $10^{14}$ atoms/cm$^3$.

Figure 5A:
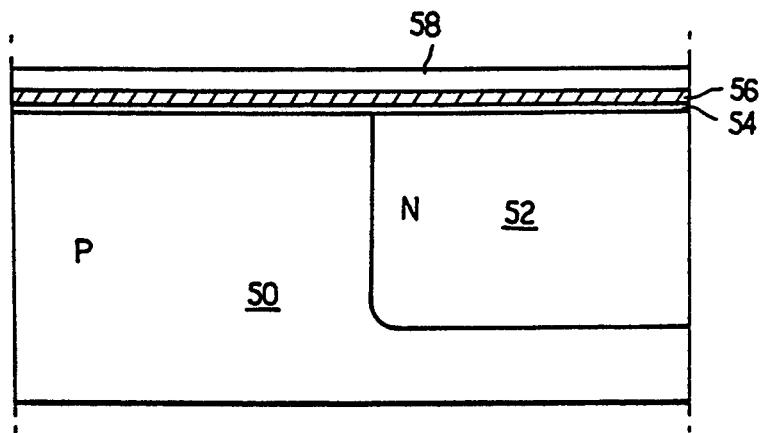
FIGS. 5(A)–(I) illustrate the processing steps of fabricating one transistor memory cell having the submerged storage capacitor according to the present invention.

In the step of FIG. 5A, the starting material is the P-type silicon semiconductor substrate 50 having the N-well 52. At first, by conventional thermal oxidation is formed the oxide layer 54 of SiO$_2$ on the substrate 50 with the thickness of 200–400 Å. Then, the nitride layer 56 of Si$_3$N$_4$ and the thick oxide layer 58 are successively formed by the conventional process. The nitride layer 56 has the thickness of about 1000–2000 Å, and is used as the oxidation protecting mask in the subsequent process. The oxide layer 58 has the thickness of about 6000–8000 Å, is formed under low temperature, and is used as the mask during the trench forming.

Figure 5B:
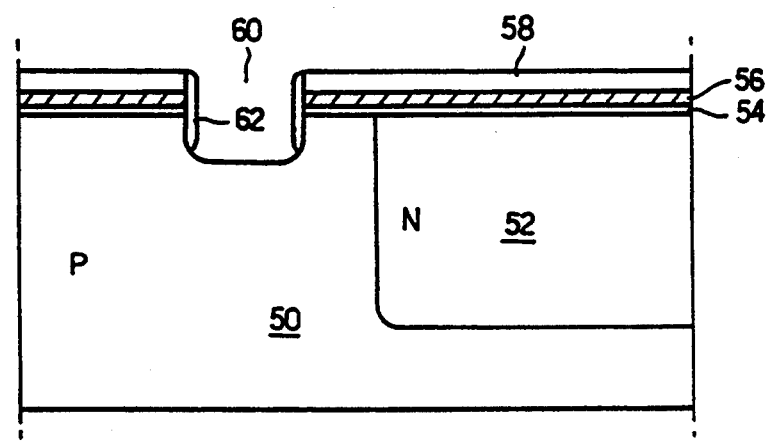
Figure 5C:
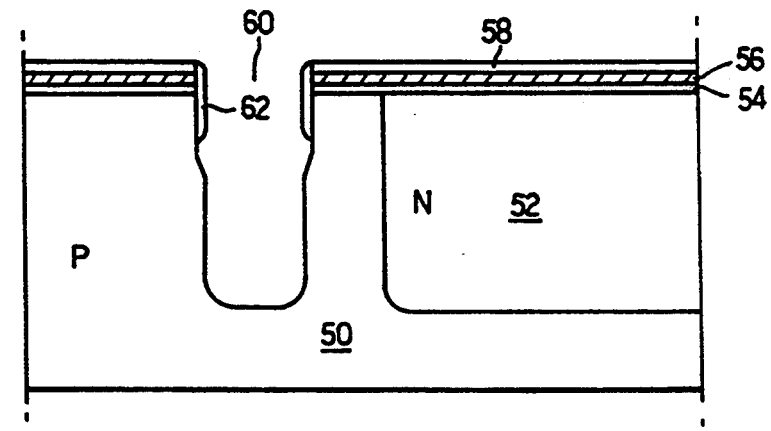

Thereafter, by photolithography are etched the oxide/nitride/oxide layers 54/56/58 to make the etching mask for forming the trench. Then, by reactive ion etching (RIE) is etched the silicon substrate 50 to form the trench 60. Subsequently, on the upper surface of the substrate and the surface of the trench 60 are formed the oxide layers having the thickness of 2000 Å by the conventional low temperature oxidation process, and by etching without a separate mask are removed the oxide layers on the bottom of the trench 60 and the surface of the substrate to form the oxide layer mask 62 on the inside walls of the trench 60 as shown in FIG. 5(B). In the bottom of the trench 60 is formed the deep trench by the reactive ion etching as shown in FIG. 5(C).

Figure 5D:
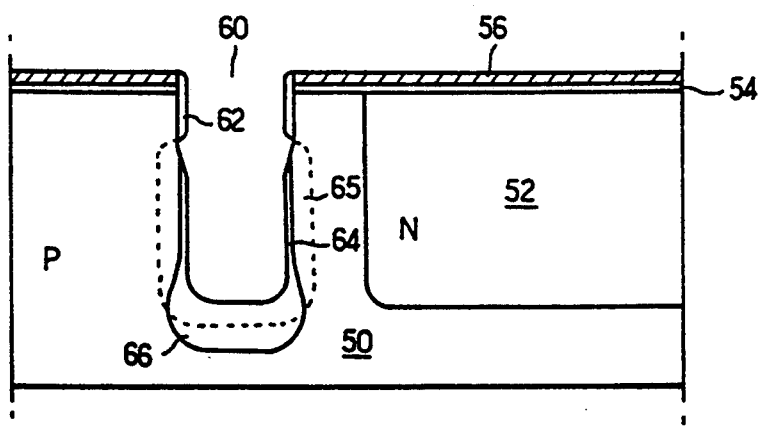

Referring to FIG. 5(D), into the exposed side walls of the trench 60 except the portion covered with the oxidation mask 62 are, at the oblique angle are, implanted the P-type ions such as boron and the N-type ions such as arsenic, respectively, at the doses of $10^{12}$–$10^{13}$ ions/cm$^2$ and $10^{14}$–$10^{15}$ ions/cm$^2$, with the energy of about 50 KeV, so as to form the P-type semiconductor region 65 and N-type semiconductor region 64 on the substrate surface outside the trench. Then, the N-type semiconductor region 66 is formed in the substrate region below the bottom of the trench by N+ ion implantation or the conventional diffusion process. The P-type semiconductor region 65 and N-type semiconductor region 64 may be formed by the conventional diffusion process.

Figure 5E:
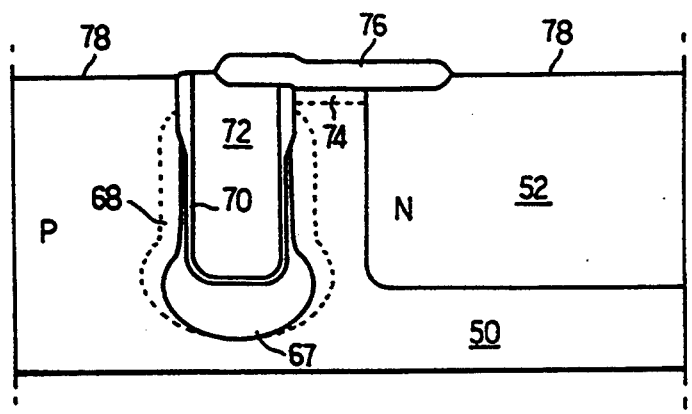

Referring to FIG. 5(E), if the doping of the trench walls is completed as above, the dopants are diffused to form the N+ cell plate 67 and the P+ region 68. The N+ cell plate region 67 serves as an electrode of the capacitor. In order to make the capacitor insulating layer, a dielectric layer 70 is formed the with an oxide layer and/or nitride layer on the side walls of the trench 60 and the surface of the substrate. In the trench 60 is filled the N+ doped polysilicon core 72. The dielectric layer 70 and the doped polysilicon 72 are formed by the conventional process. The polysilicon core 72 stores charge, and forms on electrode of the capacitor. After removing the polysilicon on the nitride layer 56, and then the nitride layer 56 and oxide layer 54 in the region to form the field oxide layer, below this region is formed the high concentration P-type doping region 74, and the field oxide layer 76 is subsequently grown. Thereafter, the nitride layer 56 and oxide layer 54 remaining in the substrate are all removed.

Figure 5F:
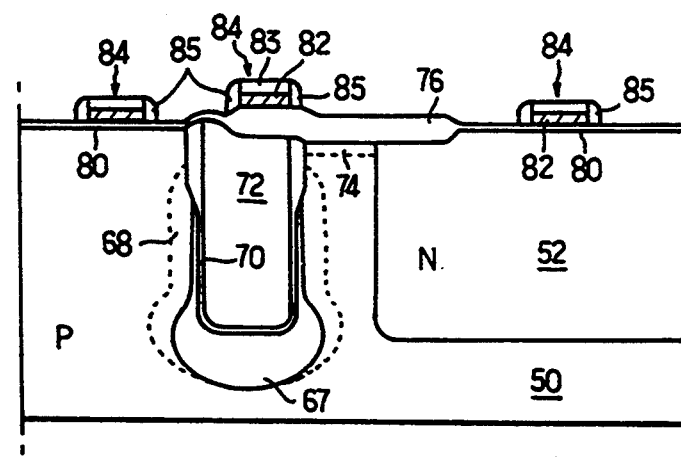

Referring to FIG. 5(F), the gate oxide layer 80 is grown on the exposed substrate surface 78 by thermal oxidation, and the conducting polysilicon layer 82 and the low temperature oxide layer 83 are formed on the entire surface of the substrate. The gate electrode pattern 84 is formed by the conventional photolithography. On the side walls of the gate electrode pattern 84 is formed the oxide spacer 85.

Figure 5G:
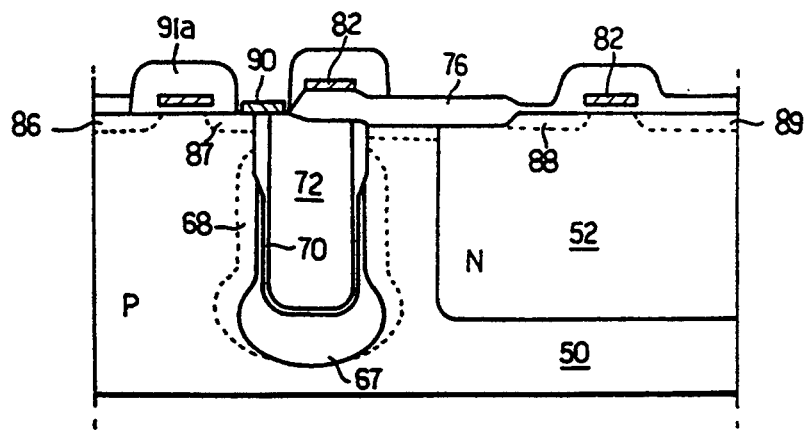

Referring to FIG. 5(G), the N+ region as the drain and source regions 86 and 87 of the N-channel MOS field effect transistor (N-MOSFET) is formed on the substrate 50, and the drain and source regions 88 and 89 of P-MOSFET are formed on the N-well 52. Then, an insulating layer 91a is coated with a low temperature oxide (LTO) or phospho silicate glass (PSG), and there is formed the polyside connecting layer 90 by etching the connection area between the conducting polysilicon core 72 and the source region 87 of the N MOSFET as the transfer transistor. The source and drain regions of the MOSFET are formed by the conventional phosphorous ion implantation. The submerged core 72 is connected with the transfer transistor through a thin conducting polysilicon layer formed by photolithography, or a silicide.

Figure 5H:
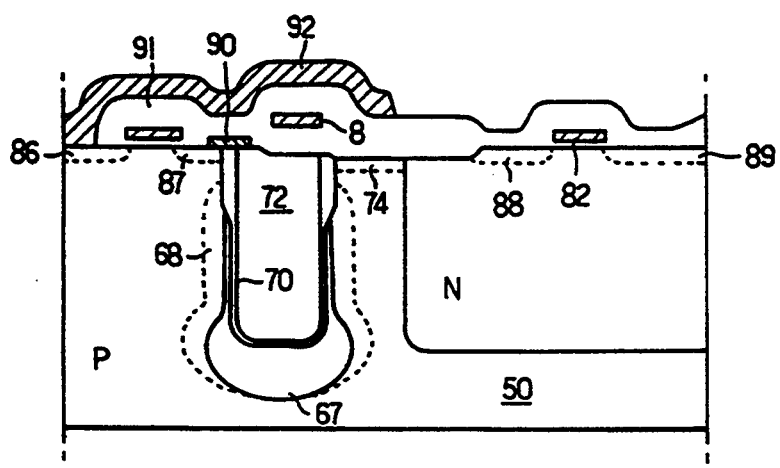

Referring to FIG. 5(H), after coating an insulating layer by the LTO or PSG layer on the entire surface, the polysilicon layer 92 is formed on the insulating layer 91 to transfer the charge of the storage capacitor, through making a contact window on the drain region 86 of the N-MOSFET.

Figure 5I:
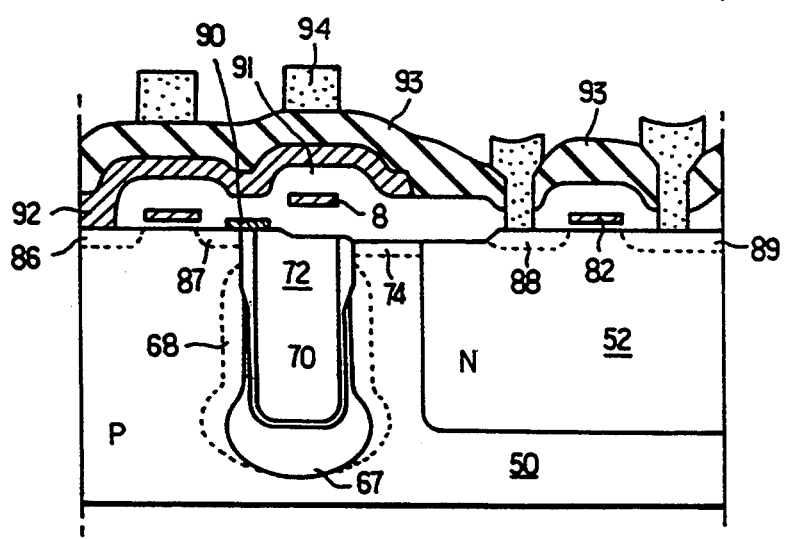

Finally, referring to FIG. 5(I), on the various elements of the semiconductor substrate 50 is formed the passivation layer 93. The N+ cell plate region 67 highly doped with the N-type impurities serves as the cell plate of the trench capacitor. By the two step formation for doping the side walls and bottom of the trench 60 is formed the effective cell plate beneath the surface of the substrate 50, which achieves an advantage of the present invention.

As described above, the present invention provides a capacitor having the submerged cell plate usable for the various integrated circuits such as one transistor memory cell, etc. of the DRAM. Of course, it will be easily appreciated by those skilled in the art that the present invention can variously be embodied without departing its scope. For example, the semiconductor substrate may be made of materials other than the silicon. Also, the cell plate region and the region outside the cell plate having the opposite conductivity are doped highly with arbitrary P-type and N-type impurities, where boron, phosphorous and arsenic are listed only by way of example. Moreover, the cell plate region may be formed variously to give substantially the same effect without departing the spirit of the present invention. Therefore, the description made above with reference to the drawings is only an example of the present invention, and does not limit the scope of the invention.

As is apparent from the above description, the charge storage is made in the polysilicon core 18 within the trench other than the inversion layer in the silicon substrate in accordance with the present invention. Hence, the charge leakage and the punch-through phenomena are considerably reduced between the trenches and the other elements in the substrate, and the immunity to noises is increased by deterioration of alpha particles. Additionally, because the cell plate is formed beneath the substrate surface, the problems are solved which appear during formation of the cell plate on the substrate with polysilicon, and the process of photolithography therefor is omitted, thereby increasing the productivity. Further, since it is possible to apply a separate voltage to the cell plate, the voltage of V$_{CC}$/2 may be applied to the cell plate, the capacitance may be increased by reducing the thickness of the capacitor dielectric layer, and the productivity may be increased by reducing the depth of the trench. Moreover, since the high concentration layer of the conductivity opposite to the cell plate is formed around the cell plate, the capacitance of the capacitor is increased and the current leakage is prevented between the transfer transistor and the cell plate.

What is claimed is:

1. In a dynamic random access memory device including a semiconductor substrate, a storage capacitor for storing charges in said semiconductor substrate, and a transfer transistor having gate, source and drain for transferring the charges to said storage capacitor, said memory device comprising:

trench means for forming a capacitor region extending vertically from the surface of and into said substrate, said trench means having an upper portion, and a lower portion formed continuously below said upper portion, said lower portion being narrower than said upper portion, and said upper portion having side-walls being masked to prevent penetration of dopants;

first dopant means for forming one electrode of said capacitor region, said first dopant means comprising impurities doped into side-walls of said lower portion of said trench means;

second dopant means formed in the substrate outside and adjacent to said first dopant means, for increasing charge storage in said capacitor region, said second dopant means surrounding and isolating said first dopant means from the surface of said substrate, said first and second dopant means being spaced-apart from the surface of said substrate;

conducting means for storing a charge corresponding to a voltage given, said conducting means being formed in said trench means;

dielectric means formed between said trench means and said conducting means to serve as an insulator of said capacitor region; and connecting means for connecting said conducting means with said transfer transistor to transfer the charge to said capacitor region.

2. A dynamic random access memory device as claimed in claim 1, further comprised of:

one of said source and said drain of said transfer transistor disposed into the surface of said substrate and separated by said dielectric means from said conducting means; and said connecting means overlying and electrically coupling said one of said source and drain with said conducting means.

3. A dynamic random access memory device as claimed in claim 1, wherein said second dopant means is formed outside of and adjacent to said first dopant means to substantially enclose said first dopant means for enabling an increase of charge storage in said capacitor region.

4. A dynamic random access memory device as claimed in claim 3, wherein said substrate is a first conductivity type, said first dopant means is a second conductivity type, and said second dopant means has the said conductivity type as said substrate.

5. A dynamic random access memory device as claimed in claim 4, wherein said first conductivity type is P-type, and said second conductivity type is N-type.

6. In a dynamic random access memory device comprising a plurality of dynamic random access memory cells having a semiconductor substrate, a storage capacitor for storing charges, and a transfer transistor having gate, source and drain for transferring the charges to said storage capacitor, said memory device comprising:

trench means for forming a capacitor region extending vertically from the surface of and into said substrate, said trench means having an upper portion, and a lower portion formed continuously below said upper portion, said lower portion being narrower than said upper portion, and said upper portion having side-walls being masked to prevent penetration of dopants;

first dopant means for forming one electrode of said capacitor region, said first dopant means comprising impurities doped into side-walls of said lower portion of said trench means;

second dopant means formed in the substrate adjacent to and outside of said first dopant means, for increasing charge storage in said capacitor region, said second dopant means surrounding and isolating said first dopant means from the surface of said substrate, and both of said first and second dopant means being spaced-apart from the surface of said substrate;

conducting means for storing a charge corresponding to a voltage given, said conducting means being formed in said trench means;

dielectric means formed between said trench means and said conducting means to serve as an insulator of said capacitor region;

connecting means for connecting said conducting means with said transfer transistor to transfer the charge to said capacitor region; and well means having the same conductivity type as said first dopant means connected with said first dopant means of a dynamic random access memory cell adjacent to one end of an array of said plurality of random access memory cells.

7. A dynamic random access memory as claimed in claim 6, further comprised of:

one of said source and said drain of said transfer transistor disposed into the surface of said substrate and separated by said dielectric means from said conducting means; and said connecting means overlying and electrically coupling said one of said source and drain with said conducting means.

8. A dynamic random access memory as claimed in claim 6, wherein said second dopant means is formed outside of and adjacent to said first dopant means to substantially enclose said first dopant means for enabling an increase of charge storage in said capacitor region.

9. A dynamic random access memory as claimed in claim 8, wherein said substrate is a first conductivity type, said first dopant means is a second conductivity type, and said second dopant means has the same conductivity type as said substrate.

10. A dynamic random access memory as claimed in claim 9, wherein said first conductivity type is a P-type, and said second conductivity type is a N-type.

11. A dynamic random access memory as claimed in claim 10, wherein a voltage of $V_{CC}/2$ is applied to said well means.

12. A dynamic random access memory device, comprising:

a semiconductor substrate;

transfer transistor means having a gate, source and drain, for transferring charges;

trench means for forming a capacitor region extending vertically from the surface of and into said substrate, said trench means having an upper portion, and a lower portion formed continuously below said upper portion, said lower portion being narrower than said upper portion, and said upper portion having side-walls being masked to prevent penetration of dopants;

first dopant means for forming a first electrode for said capacitor region, said first dopant means comprising impurities doped into side-walls of said lower portion of said trench means;

second dopant means formed in the substrate outside of and adjacent to said first dopant means, for increasing charge storage in said capacitor region, said second dopant means surrounding and isolating said first dopant means from the surface of said substrate, and both said first and second dopant means being spaced-apart from the surface of said substrate;

storage means for storing a charge in response to a given voltage, said storage means being formed in said trench means;

dielectric means formed between said trench means and said storage means to serve as an insulator of said capacitor region; and connecting means for connecting said storage means with said transfer transistor means.

13. A dynamic random access memory device as claimed in claim 12, wherein said second dopant means is formed outside of and adjacent to said first dopant means to substantially enclose said first dopant means for enabling an increase of charge storage in said capacitor region.

14. A dynamic random access memory device as claimed in claim 13, wherein said substrate is a first conductivity type, said first dopant means is a second conductivity type, and said second dopant means has the same conductivity type as said substrate.

15. A dynamic random access memory device as claimed in claim 14, wherein said first conductivity type is a P-type, and said second conductivity type is a N-type.

16. A dynamic random access memory device and a transfer transistor having gate, source and drain regions for transferring electric charges to a storage capacitor, said memory device comprising:

trench means for forming a capacitor region extending vertically from the surface of a substrate into said substrate, said trench means having an upper portion, and a lower portion formed continuously below said upper portion, said lower portion being narrower than said upper portion, and said upper portion having side-walls being masked to prevent penetration of dopants;

first dopant means for forming one electrode of said capacitor region, said first dopant means comprising impurities doped into side-walls of said lower portion of said trench means;

second dopant means disposed in the substrate outside of and adjacent to said first dopant, for increasing charge storage in said capacitor region, said second dopant means surrounding and isolating said first dopant means from the surface of said substrate, said first and second dopant means being spaced-apart from the surface of said substrate;

conducting means for storing a charge corresponding to a voltage given, said conducting means being formed in said trench means; and dielectric means formed between said trench means and said conducting means to serve as an insulator of said capacitor region.

17. A dynamic random access memory as claimed in claim 16, wherein said second dopant means is formed outside of and adjacent to said first dopant means to substantially enclose said first dopant means for enabling an increase of charge storage in said capacitor region.

18. A dynamic random access memory device as claimed in claim 17, wherein said substrate is a first conductivity type, said first dopant means is a second conductivity type, and said second dopant means has the same conductivity type as said substrate.

19. A dynamic random access memory device as claimed in claim 18, wherein said first conductivity is a P-type, and said second conductivity type is a N-type.

20. A semiconductor device, comprising:

a substrate of a material having a first type conductivity;

trench means for forming a capacitor region extending vertically from one surface of and into said substrate, said trench means having an upper portion, and a lower portion formed continuously below said upper portion, said lower portion being narrower than said upper portion, and said upper portion having side-walls being masked to prevent penetration of dopants;

first dopant means of a second type conductivity, for forming one electrode of said capacitor region, formed in the substrate, into side-walls of said lower portion of said trench means;

second dopant means of said first type conductivity formed in the substrate outside of and adjacent to said first dopant means, for reducing leakage current, said second dopant means surrounding and isolating vertical portions of said first dopant means from the material of said substrate having said first type conductivity;

conducting means for storing a charge, formed within said trench means;

dielectric means for isolating said conducting means from said first dopant means, disposed between said conducting means and said first dopant means; and means for connecting said conducting means to other regions of the semiconductor device.

21. The semiconductor device of claim 20, further comprised of:

said first dopant means adjoining said material of said substrate having said first type conductivity in a volume of said substrate positioned vertically beneath and separated from said one surface by said trench means.

22. The semiconductor device of claim 20, further comprised of:

said first and second dopant means being spaced-apart from said one surface; and said first dopant means adjoining said material of said substrate having said first type conductivity in a volume of said substrate positioned vertically beneath and separated from said one surface by said trench means.

23. The semiconductor device of claim 20, further comprised of:

one of a source and a drain region disposed into said one surface and separated by said dielectric means from said conducting means; and said connecting means overlying and electrically coupling said one of said source and drain region with said conducting means.

24. The semiconductor device of claim 20, further comprised of:

one of a source and a drain region disposed into said one surface and separated by said dielectric means from said conducting means; and said connecting means overlying and electrically coupling said one of said source and drain region with said conducting means.

25. The semiconductor device of claim 21, further comprised of:

one of a source and a drain region disposed into said one surface and separated by said dielectric means from said conducting means; and said connecting means overlying and electrically coupling said one of said source and drain region with said conducting means.

26. The semiconductor device of claim 22, further comprised of:

one of a source and a drain region disposed into said one surface and separated by said dielectric means from said conducting means, said one of said source and drain region being spaced apart from said first and second dopant means; and said connecting means overlying and electrically coupling said one of said source and drain region with said conducting means.

27. The semiconductor device of claim 20, further comprised of:

one of a source and a drain region disposed into said one surface and separated by said dielectric means from said conducting means;

said second dopant means separating said first dopant means from said one of said source and drain region; and said connecting means overlying and electrically coupling said one of said source and drain region with said conducting means.

28. The semiconductor device of claim 22, further comprised of:

one of a source and a drain region disposed into said one surface and separated by said dielectric means from said conducting means;

said second dopant means separating said first dopant means from said one of said source and drain region; and said connecting means overlying and electrically coupling said one of said source and drain region with said conducting means.

29. The semiconductor device of claim 21, further comprised of:

one of a source and a drain region disposed into said one surface and separated by said dielectric means from said conducting means;

said second dopant means separating said first dopant means from said one of said source and drain region; and said connecting means overlying and electrically coupling said one of said source and drain region with said conducting means.

30. A semiconductor device, comprising:

a substrate of a material having a first type conductivity;

a plurality of trenches for forming a plurality of discrete capacitor regions arranged in an array with each of said trenches extending vertically from one surface of and into said substrate, each of said trenches having an upper portion, and a lower portion formed continuously below said upper portion, said lower portion being narrower than said upper portion, and said upper portion having side-wall being masked to prevent penetration of dopants;

first dopant means of a second type conductivity disposed in the substrate, into side-walls of said lower portion of each of said trenches, for forming a first electrode for each of said capacitor regions;

second dopant means of said first type conductivity formed in the substrate adjacent to and around outside surfaces of said first dopant means oriented vertically to said one surface of said substrate, for reducing leakage current, said second dopant means surrounding and isolating said vertically oriented surfaces of said first dopant means from said material of said substrate having said first type conductivity, said first and second dopant means being spaced-apart from said one surface of said substrate, and said first dopant means extending beneath said second dopant means and adjoining said material of said substrate having said first type conductivity in a volume of said substrate vertically beneath and separated from said one surface of said substrate by each of said trenches;

conducting means for storing a charge, disposed within each of said trenches, for forming a second electrode for each of said capacitor regions;

dielectric means for isolating said conducting means from said first dopant means within each of said trenches, disposed between said conducting means and said first dopant means; and means for connecting said conducting means to other regions of the semiconductor device and for transferring charges between said capacitor regions.

31. The semiconductor device of claim 30, wherein said second dopant means is formed outside of and adjacent to said first dopant means to substantially enclose said first dopant means for enabling an increase of charge storage in each of said capacitor regions.

32. The semiconductor device of claim 30, further comprised of:

one of a source and a drain region disposed into said one surface and separated by said dielectric means of one of said plurality of capacitor regions from said conducting means corresponding to the same one of said capacitor regions, said one of said source and drain region being spaced apart from said first and second dopant means; and said connecting means overlying and electrically coupling said one of said source and drain region with said conducting means.

33. A semiconductor memory device, comprising:

a substrate of a first type conductivity;

a trench for forming a capacitor region extending from one surface of and into said substrate, said trench having an upper portion and a lower portion narrower than said upper portion;

first dopant means of a second type conductivity, for forming a first electrode of said capacitor region, formed in the substrate and around said lower portion of said trench;

second dopant means of said first type conductivity, for reducing leakage current, formed in the substrate, outside of, adjacent to, and substantially enclosing said first dopant means;

conducting means for storing a charge, disposed within said trench, for forming a second electrode of said capacitor region;

dielectric means disposed between said conducting means and said first dopant means, for isolating said conducting means from said first dopant means; and means for connecting said conducting means to other regions of the semiconductor memory device.

34. The semiconductor memory device as claimed in claim 33, further comprised of:

said second dopant means surrounding and isolating said first dopant means from the surface of said substrate, said first and second dopant means being spaced-apart from the surface of said substrate.

35. A semiconductor memory device comprising a substrate, a storage capacitor for storing charges in said substrate, and a transfer transistor having a gate, source and drain regions for transferring the charges to said storage capacitor, said semiconductor memory device comprising:

a trench for forming said storage capacitor extending vertically from the surface of and into said substrate, said trench having an upper portion, and a lower portion narrower than said upper portion, said upper portion having sidewalls being masked to prevent penetration of dopants;

first dopant means for forming a first electrode of said storage capacitor, said first dopant means comprising impurities of a first conductivity type doped into sidewalls of said lower portion of said trench;

second dopant means for blocking leakage current and preventing crosstalk between said first dopant means and said source region of said transfer transistor, said second dopant means comprising impurities of a second conductivity type doped in the substrate, and formed outside of and adjacent to said first dopant means to substantially enclose said first dopant means and isolate said first dopant means from the surface of said substrate for enabling an increase of charge storage in said storage capacitor;

conducting means disposed within said trench, for forming a second electrode of said storage capacitor to store said charges corresponding to a given voltage transferred by said transfer transistor;

dielectric means formed on sidewalls of said trench means and disposed between said conducting means and said first dopant means, for serving as an insulator of said storage capacitor; and connecting means for connecting said conducting means with said source region of said transfer transistor to transfer the charges to said storage capacitor.

36. The semiconductor memory device as claimed in claim 35, further comprises:

said source region being disposed into the surface of said substrate, separated by said dielectric means from said conducting means, and spaced apart from said first and second dopant means; and said connecting means overlying and electrically coupling said source region with said conducting means.

* * * * *

UNITED STATES PATENT AND TRADEMARK OFFICE
CERTIFICATE OF CORRECTION

PATENT NO. : 5,432,365
DATED : Jul. 11, 1995
INVENTOR(S) : Dae-Je Chin, et al.

It is certified that error appears in the above-indentified patent and that said Letters Patent is hereby corrected as shown below:

| | | |
|---|---|---|
| Column 2, | Line 21, | after "region," change "said" to --the--; (2nd occurrence) |
| | Line 39, | after "in", change "said" to --the--; |
| | Line 43, | after "substrate,", change "said" to --the--; |
| Column 3, | Line 12, | after "FIGS.", change "5(A)-(I)" to --5A-5I--; |
| | Line 58, | after "having", change "the" (the third occurrence) to --a--; |
| Column 4, | Line 7, | before "32", insert --layer--; |
| | Line 51, | after "voltage", delete "is supplied through the N-well 47"; |
| | Line 52, | after "14" and before "Hence", insert --is supplied through the N-well 47--; |

UNITED STATES PATENT AND TRADEMARK OFFICE
CERTIFICATE OF CORRECTION

PATENT NO. : 5,432,365
DATED : Jul. 11, 1995
INVENTOR(S) : Dae-Je Chin, et al.

It is certified that error appears in the above-indentified patent and that said Letters Patent is hereby corrected as shown below:

| | | |
|---|---|---|
| Column 4, | Line 56, | after "interconnection", insert --(shown in Figure 2)--; |
| | Line 61, | after "FIGS.", change "5(A)-5(I)" to --5A-5I--; |
| Column 5, | Line 7, | after "with", change "the" (the first occurrence) to --a--; |
| | Line 26, | after "FIGS.", change "5(B)" to --5B--; |
| | Line 28, | after "FIGS.", change "5(C)" to --5C--; |
| | Line 29, | after "FIGS.", change "5(D)" to --5D--; |
| | Line 44, | after "FIGS.", change "5(E)" to --5E--; |
| | Line 48, | after "make", change "the" to --a--; |

UNITED STATES PATENT AND TRADEMARK OFFICE
CERTIFICATE OF CORRECTION

PATENT NO. : 5,432,365
DATED : Jul. 11, 1995
INVENTOR(S) : Dae-Je Chin, et al.

It is certified that error appears in the above-indentified patent and that said Letters Patent is hereby corrected as shown below:

|  |  |  |
|---|---|---|
|  | Line 49, | after "formed", delete "the"; |
|  | Line 53, | between "polysilicon" and "72", insert --core--; |
|  | Line 55, | after "forms", change "on" to --one--; |
|  | Line 63, | after "FIGS.", change "5(F)" to --5F--; |
| Column 6, | Line 3, | after "FIGS.", change "5(G)" to --5G--; |
|  | Line 19, | after "FIGS.", change "5(H)" to --5H--; and |
|  | Line 25, | after "FIGS.", change "5(I)" to --5I--:

UNITED STATES PATENT AND TRADEMARK OFFICE
CERTIFICATE OF CORRECTION

PATENT NO. : 5,432,365
DATED : Jul. 11, 1995
INVENTOR(S) : Dae-Je Chin, et al.

It is certified that error appears in the above-indentified patent and that said Letters Patent is hereby corrected as shown below:

Claim 4, Line 62, before "conductivity", change "said" (the first occurrence) to --same--;

Claim 36, Line 28, before "source", delete "said"; and

Signed and Sealed this

Twenty-sixth Day of August, 1997

Attest:

BRUCE LEHMAN

*Attesting Officer*     *Commissioner of Patents and Trademarks*